(12) United States Patent
Dietz et al.

(10) Patent No.: US 7,508,209 B2
(45) Date of Patent: Mar. 24, 2009

(54) MAGNETIC RESONANCE APPARATUS WITH A GRADIENT COIL UNIT WITH INTEGRATED PASSIVE SHIM DEVICES

(75) Inventors: Peter Dietz, Fürth (DE); Johann Schuster, Oberasbach (DE); Stefan Stocker, Grossenseebach (DE)

(73) Assignee: Siemens Aktiengesellschaft, Munich (DE)

( * ) Notice: Subject to any disclaimer, the term of this patent is extended or adjusted under 35 U.S.C. 154(b) by 294 days.

(21) Appl. No.: 11/415,723

(22) Filed: May 2, 2006

(65) Prior Publication Data

US 2006/0262826 A1    Nov. 23, 2006

(30) Foreign Application Priority Data

May 2, 2005    (DE)    ............... 10 2005 020 378

(51) Int. Cl.
*G01V 3/00*    (2006.01)
(52) U.S. Cl. ............... 324/318; 324/322; 324/320; 324/306; 324/307
(58) Field of Classification Search ......... 324/300–322; 600/407–435
See application file for complete search history.

(56) References Cited

U.S. PATENT DOCUMENTS

| | | | | |
|---|---|---|---|---|
| 4,612,505 A | * | 9/1986 | Zijlstra | ............... 324/318 |
| 4,748,413 A | | 5/1988 | Frese et al. | ............... 324/318 |
| 4,990,877 A | * | 2/1991 | Benesch | ............... 335/301 |
| 5,235,284 A | * | 8/1993 | Tahara et al. | ............... 324/320 |
| 5,343,183 A | * | 8/1994 | Shimada et al. | ............... 335/301 |
| 5,479,144 A | * | 12/1995 | Gurol | ............... 335/216 |
| 5,635,839 A | * | 6/1997 | Srivastava et al. | ............... 324/320 |
| 6,798,205 B2 | * | 9/2004 | Bommel et al. | ............... 324/319 |
| 6,822,453 B2 | * | 11/2004 | Boemmel et al. | ............... 324/320 |
| 6,867,592 B2 | * | 3/2005 | Gebhardt et al. | ............... 324/318 |
| 7,009,397 B2 | * | 3/2006 | Schuster et al. | ............... 324/318 |
| 7,109,715 B2 | * | 9/2006 | Heid et al. | ............... 324/322 |
| 2003/0206018 A1 | * | 11/2003 | Gebhardt et al. | ............... 324/318 |
| 2003/0214300 A1 | * | 11/2003 | Bommel et al. | ............... 324/318 |
| 2003/0222650 A1 | * | 12/2003 | Boemmel et al. | ............... 324/322 |
| 2005/0099183 A1 | * | 5/2005 | Heid et al. | ............... 324/322 |
| 2006/0262826 A1 | * | 11/2006 | Dietz et al. | ............... 372/96 |

FOREIGN PATENT DOCUMENTS

DE    102 19 769 B3    1/2004

* cited by examiner

*Primary Examiner*—Brij B. Shrivastav
*Assistant Examiner*—Tiffany A Fetzner
(74) *Attorney, Agent, or Firm*—Schiff Hardin LLP

(57) ABSTRACT

A magnetic resonance apparatus has a gradient coil unit with passive shim devices inserted into side receptacles in the molded body of the gradient coil unit. Each shim device has a carrier with a number of metal elements, the metal elements being mounted on the carrier in linear succession and being situated essentially orthogonally to the longitudinal axis of the carrier.

17 Claims, 3 Drawing Sheets

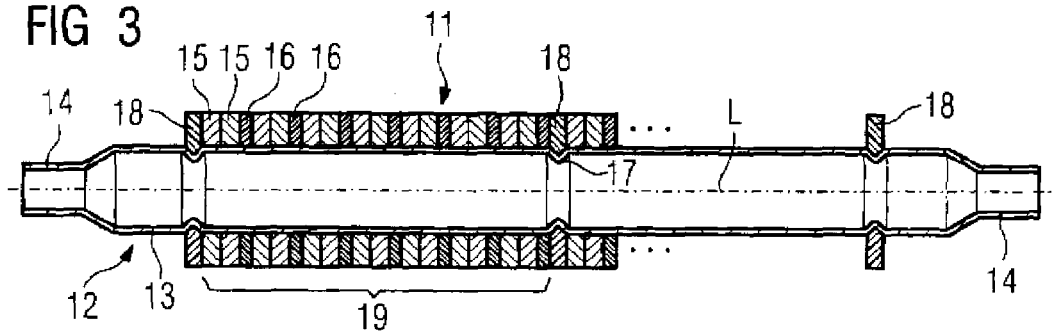
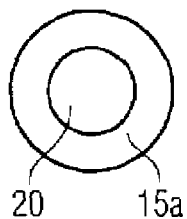 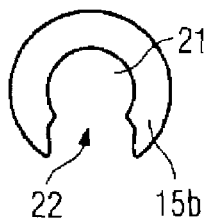 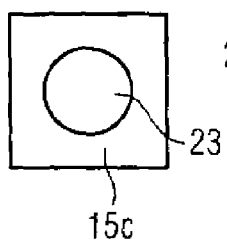 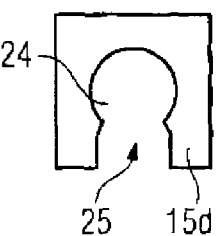
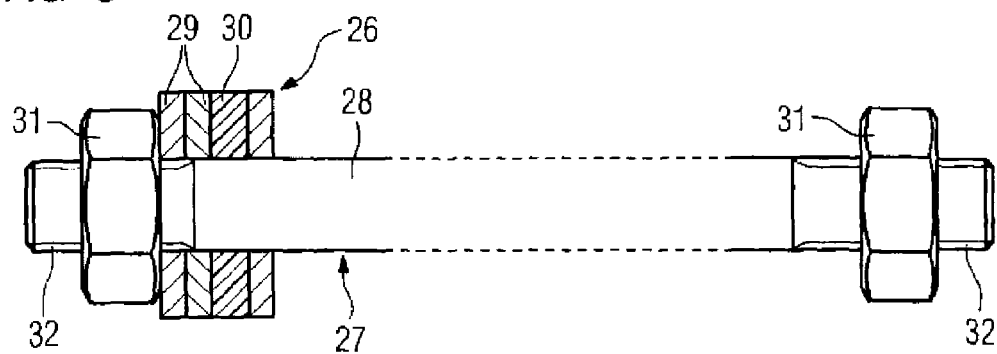
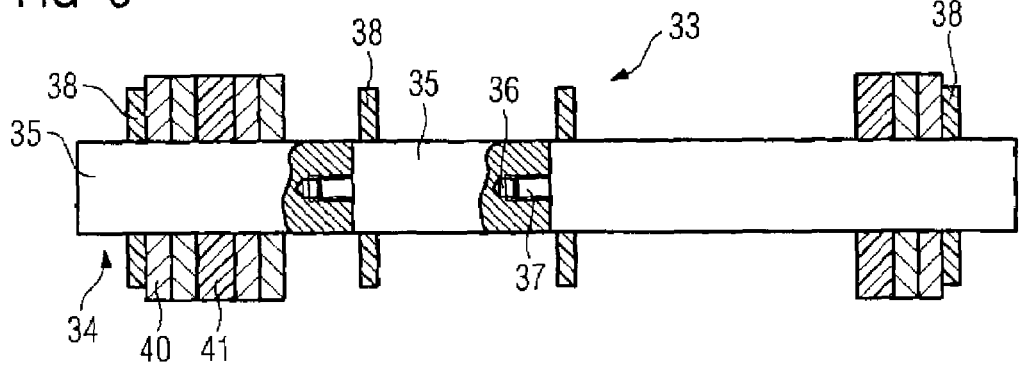

MAGNETIC RESONANCE APPARATUS WITH A GRADIENT COIL UNIT WITH INTEGRATED PASSIVE SHIM DEVICES

BACKGROUND OF THE INVENTION

1. Field of the Invention

The present invention concerns a magnetic resonance apparatus of the type having a gradient coil with passive shim devices inserted into receptacles in the unit, each shim device being formed by a number of ferromagnetic metal elements.

2. Description of the Prior Art

To improve the homogeneity of the basic magnetic field within the measurement volume of a cylindrical magnetic resonance apparatus, shim devices (formed by disc-shaped, laminar metal elements, in particular iron discs) are used that are inserted into separate receptacles in the form of pockets molded into the gradient coil unit and arranged around the measurement volume in a cylindrical wall. This metal or iron arrangement is known as a passive shim. The shim arrangement in total can have several hundred metal discs. The locations of the discs and their number are normally determined via an iterative calculation method for which the measurement field homogeneity is measured relative to a spherical volume and the required iron quantity is calculated for the sites of the respective receptacles on the gradient coil unit. When the required iron quantity per shim device is known, the very thin iron plate discs are counted by hand and inserted into the apparatus compartments of the carrier. Such a carrier is executed as a type of drawer or tray that has a number (for example 16) of rectangular compartments molded back-to-back and open at the top, into which the individual discs (which sometimes vary with regard to their size and thickness in order to be able to approach as optimally as possible the calculated iron quantity) are inserted. Each compartment at the carrier is then manually sealed with a cover plate and the shim device is inserted into the coil receptacle. This method is very time-consuming and occupies approximately 2-3 days for a new installation. Errors are easily possible since, as stated, the discs must be counted and inserted by hand. It is easily possible to count too few or too many discs or to insert discs of the wrong size etc. A further disadvantage is that the occupancy of a pocket can be checked only by removing the entire disc packet, since the discs are not visible from the exterior of the pocket due to being arranged lying atop one another.

SUMMARY OF THE INVENTION

An object of the present invention is to provide a magnetic resonance apparatus with an improved, simpler design of the shim devices.

This object is achieved in accordance with the invention by a magnetic resonance apparatus of the aforementioned type wherein the ferromagnetic metal elements are retained on the carrier linearly, in a series one after the other, and are situated substantially orthogonal to the longitudinal axis of the carrier.

In the inventive magnetic resonance apparatus, the individual elements are no longer arranged in individual compartments that are separate from one another in the form of a number of separate disc packets each having a number of individual discs stacked one atop the other, as in the prior art. Instead; rather, all metal elements are arranged in a series one after the other on a carrier, and they are all positioned orthogonal to longitudinal axis of the carrier and thus also to the coil longitudinal axis. As a consequence of this uniform alignment and arrangement, all metal elements can be unambiguously recognized during the equipping, such that errors can be detected immediately and corrected. The arrangement aligned orthogonal to the carrier longitudinal axis furthermore allows the desired iron quantity per longitudinal segment (with regard to the coil length) to be introduced without further measures, and it does not depend on the form of the metal elements or their alignment relative to the coil volume, but rather depends only on the local iron or metal quantity relative to the coil segment. In this context, insofar as necessary, laminar, disc-shaped, non-metallic spacers can also be placed between the metal elements in an alignment likewise orthogonal to the longitudinal axis of the carrier in order to be able to optimally adjust the iron quantity per longitudinal segment. The carrier of each subsequently-described embodiment can itself be made of metal, but preferably is produced from plastic.

In a first advantageous embodiment of the invention, the metal elements are stacked on a rod-shaped or tube-shaped carrier that passes through each metal element through a cutout pr a recess in each metal element. The metal elements can be slid onto the rod-shaped or tube-shaped carrier (possibly in combination with non-metallic spacers) that passes through each of them. In this manner, the metal elements or spacer elements can be stacked in series without further measures in a sequence (order) as predetermined by the calculated quantity plan that predetermines the local iron quantity for the homogenization of the field.

The rod-shaped or tube-shaped carrier can be formed in one piece, but it is also possible to form it from a number of carrier segments that can be detachably connected with one another by screw or plug connections, which enables a simple adaptation of the carrier length to the existing coil unit length. This means that, in this embodiment, the carrier can have standardized carrier segments depending on a given coil unit length.

In order to avoid accumulation of tolerances that can result over the entire carrier length due to possible thickness variations of the individual metal and spacer elements, it is advantageous to packetize the metal elements together with possibly-present spacer elements relative to the carrier length, i.e., to fashion individual segments within which one metal and spacer element packet is arranged. For this purpose, the carrier is appropriately divided into a number of segments over its length, the segments being defined by carrier grooves in which separation elements (in particular snap rings) are arranged. These snap rings (possibly optically emphasized by corresponding coloring) respectively define a segment that is equipped (populated) according to the predetermined equipping plan. A possible tolerance can only occur relative to the interval length; the position of the intervals is fixed relative to the carrier length, such that a tolerance accumulation cannot occur.

As an alternative to the embodiment using the grooves together with inserted separator elements, it is possible to brace the entire metal and spacer element packet relative to the entire carrier length in order to be able to compensate the length tolerance depending on the bracing pressure.

If carrier segments that are to be assembled separately are used, it is appropriate to provide a separator element on at least one end of a carrier segment, preferably at both, these carrier elements in turn forming a defined longitudinal segment by their separation in a carrier segment in which longitudinal segment the metal and spacer elements are arranged, this does not lead to tolerance addition in this embodiment.

The metal elements and, if applicable, spacer elements each can have a circular closed recess or a recess open to one side. Given a closed recess, which (depending on the cross-section of the carrier) can also be rectangular or oval, the metal and spacer elements are slid onto the carrier end. Given a recess open to one side, in addition to such sliding it is also possible to push or snap the elements onto the carrier from the side. This embodiment also allows a simple exchange of a metal element or spacer, such as when the entire design must be changed in a further iteration step to optimize the field homogeneity. It is then possible to pull off individual metal or spacer elements from the carrier orthogonal to the carrier longitudinal axis and to insert a new element.

Heating of the shim devices is a further problem in known magnetic resonance apparatuses using the passive shim devices. Since the magnetic properties are temperature-dependent and a heat transfer due to eddy currents as well as due to heat conduction over the gradient coil unit cannot be avoided, the measurement field homogeneity fluctuates dependent on the temperature of the metal elements of the shim devices. An embodiment of the invention addresses this additional problem by providing connectors at both ends of a tube-shaped carrier to allow connection to a coolant line. The tube-shaped carrier thus serves not only as an element mount but also for conducting a coolant that flows into the carrier at one end and is discharged at the other end. For this purpose, coolant lines need only to be provided at the connectors of the carrier.

In a further embodiment of the carrier, the carrier is tube-shaped or half-pipe-shaped (a tube cut longitudinally in half through its center) that is transparent at least in segments and/or is open over its length. In such a carrier the metal elements and (if applicable) the non-metallic spacer elements are inserted and stacked orthogonally to the carrier longitudinal axis. Here the elements are not slid onto the carrier but rather are inserted into the carrier in segments in the case of a half-pipe-shaped carrier or as a whole in the case of a closed or sealable tube carrier. In order to be able to control the stacking, in the case of a tube carrier embodiment this is preferably transparent (thus is, for example, formed from a transparent plastic tube). Alternatively, it is possible to form the tube-shaped carrier from two half-shells that can be connected with one another in a detachable manner, or are connected with one another in a hinged manner. This enables the elements to be inserted into the half-shell and (when the connection has been established) to attach the second half-shell or to pivot it toward the first half-shell. to allow monitoring even given a closed carrier, one of the half-shells can be formed of transparent plastic.

In another embodiment of the carrier, it is formed by means of only one half-shell in which the elements are arranged. Here the carrier is not closed on all sides.

Even in the embodiment of the carrier as a tube or half-pipe, the carrier can be divided along its length into a number of segments that are defined by separator elements arranged on at least one of the half-shells. These separator elements preferably are permanently connected to the respective half-shell (for example injection-molded in the case of a plastic shell).

To allow cooling in the gradient coil unit given such a carrier, the carrier in the coil unit receptacle is preferably separated by spacers from the inner wall of the receptacle, such that a coolant channel is formed between the inner wall and the carrier, in which coolant can circulate through corresponding connectors at the front side of the gradient coil.

Depending on the design of the metal or spacer element shape, or the carrier shape, the shim device itself can exhibit a round or polygonal (in particular quadratic) cross-section, with the coil unit receptacle being correspondingly shaped (molded).

DESCRIPTION OF THE DRAWINGS

FIG. 3 is a sectional view of a shim device in accordance with the invention in a first embodiment.

FIGS. 4A-4D show various embodiments of the metal or spacer elements in accordance with the invention.

FIG. 5 is a sectional view of an inventive shim device in a second embodiment.

FIG. 6 is a sectional view of an inventive shim device in a third embodiment.

DESCRIPTION OF THE PREFERRED EMBODIMENTS

Figure 1:
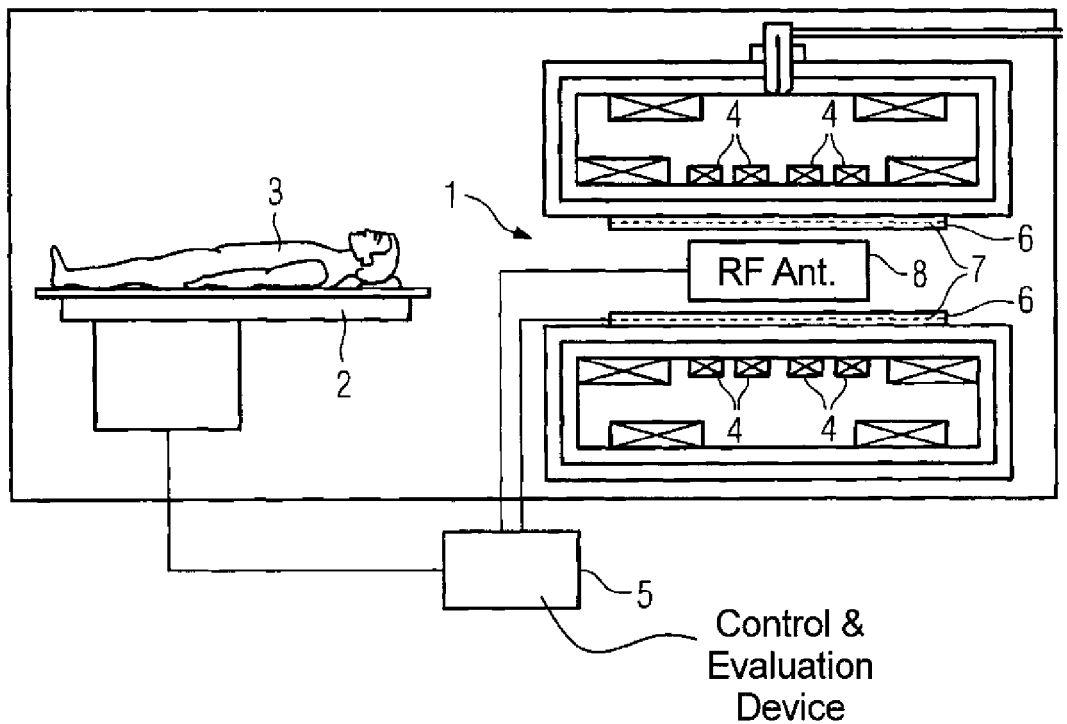
FIG. 1 is a schematic illustration of the basic components of a known magnetic resonance apparatus in which the invention can be used.

FIG. 1 shows an inventive magnetic resonance apparatus 1 in a known embodiment. An examination subject 3 (here a person) can be introduced into the examination region by means of a patient bed 2. The examination region (which corresponds to the examination volume) is occupied by a basic magnetic field generated by a basic field magnet 4. The basic magnetic field is temporally constant (static) and spatially as homogeneous as possible and exhibits a measurement field strength that is preferably 3 T or more. The basic field magnet 4 is usually fashioned as a superconductor. A control and evaluation device 5 controls the system operation and also represents the image reconstruction components.

The magnetic resonance apparatus also has a gradient coil unit 6 carrying gradient coils (now shown) that respectively generate orthogonal gradient fields in the examination region. The coils of the gradient coil unit 6 can be activated by the control and evaluation device 5 such that gradient currents that serve for the field generation flow therein. The cylindrical gradient coil unit 6 also contains a number of shim devices 7 circumferentially distributed around the patient acceptance opening and schematically shown dashed in FIG. 1. An RF antenna 8 serves as a transmission antenna for image generation and as a reception antenna for acquisition of signals. The RF antenna 8 can be activated by the control and evaluation device 5 such that appropriate excitation currents flow therein according to the excitation parameters that exist in the control and evaluation device 5. This design of a magnetic resonance apparatus is known and needs no further detailed explanation.

Figure 2:
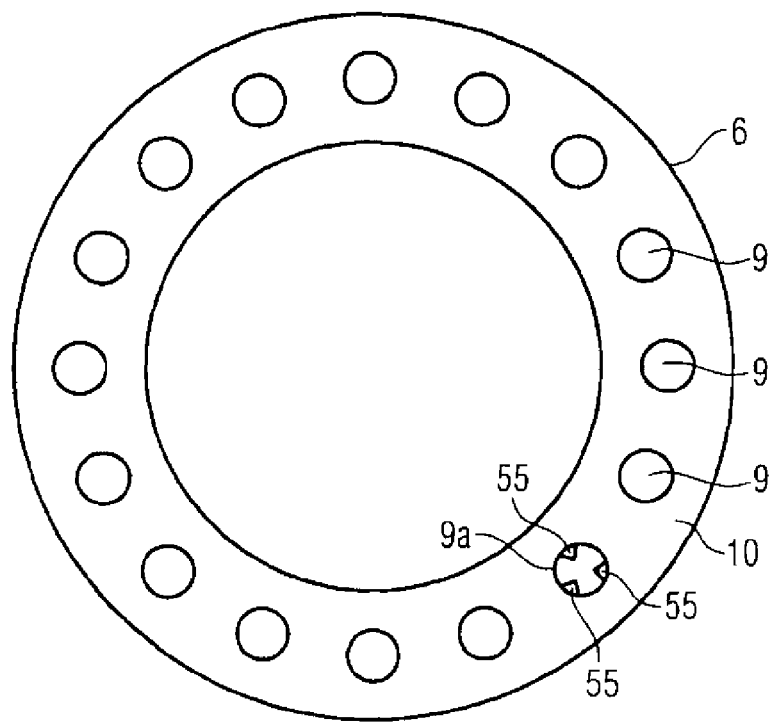
FIG. 2 is a front view of the gradient coil unit of the magnetic resonance apparatus of FIG. 1, modified according to an embodiment of the invention.

FIG. 2 shows a front view of the cylindrical gradient coil unit 6, having a molded body 10. A number of receptacles in the shape of cylindrical bores extend along the entire longitudinal length of the gradient coil unit 6 and of the coil cast body 10, and are symmetrically distributed around the circumference. A shim device is installed or inserted into each receptacle 9.

FIG. 3 shows a first exemplary embodiment of such a shim device 11, having a carrier 12 that here is formed by a hollow-cylindrical tube 13. At each end of the tube 13 is a connector 14 for connection of a coolant line so that coolant (for example water) can be conveyed through the tube 13 for cooling. A number of individual metal elements 15 and spacer elements 16 made of plastic that form the passive shim of the gradient coil unit 6 are slid onto the tube 13. For example, the metal elements 15 and the plastic spacer elements 16 a ring shape 15a as shown in FIG. 4A, and thus can be slid onto the carrier 12 with the tube 13 proceeding through the central opening 20 of each element. They are thus arranged linearly one after another and are situated with their plate or disc plane orthogonal to the longitudinal axis L of the carrier 12. The sequence of the arrangement of the metal elements 15 and spacer elements 16 one after another results from a suitable calculation with regard to the metal quantity to be introduced into the gradient coil unit 6 by the shim device and its required positioning relative to the longitudinal coil axis. This ensues using a suitable calculation program with regard to an idealized spherical volume in which an optimally-homogeneous measurement field should be generated. This means that the sequence between metal elements 15 and spacer elements 16 is ultimately arbitrary.

In order to avoid accumulation of position differences (possibly resulting from the stacking one after another along the length of the tube 13 (that essentially corresponds in its entirety to the length of a receptacle 9, therefore to the length of the gradient coil unit 6)) radial countersinks 17 are provided on the tube 13 in which separator elements 18 are inserted (for example in the form of snap rings that can be made from plastic and may be colored such that they are easily visible). These separator elements 18 serve as separations for the respective packet (composed of metal elements 15 and spacer elements 16) introduced in a segment 19 between two separator elements 18, such that these metal elements 15 and spacer elements 16 can be braced with sufficient rigidity between the separator elements 18.

All metal and spacer elements 15 and 16 are thus clearly visible during and after the mounting (thus on the finished shim device 11), such that possible errors can be detected immediately. When equipping ensues by hand, sliding onto the tube 13 also proceeds significantly quickly than the elaborate manual placement and alignment of the discs in the planar receptacles in known drawer (tray) carriers.

FIGS. 4A-4D show different shapes and embodiments of the metal elements 15 or, respectively, the spacer elements 16. The metal element 15a shown in FIG. 4a is executed as a ring (the same naturally applies for a spacer element, but for simplicity, only the embodiment of a metal element is described in the following); it exhibits a circular closed cut 20 through which the tube 13 passes. The cut diameter and the tube diameter correspond to one another, such that a secure seating results that nevertheless enables a simple sliding.

The metal element 15b shown in FIG. 4B is likewise annular, but has a cutout 21 open to the side that enables the metal element 15b (and naturally, correspondingly a spacer element so shaped) to be slid or to be snapped onto the tube 13 from the side. This embodiment enables individual metal elements or spacer elements to be pulsed from the segment-oriented combination and exchanged for others in the case of an error or given an iterative change of the population of the tube 13. The forward width of the slide opening 22 essentially corresponds to the diameter of the tube 13 and tapers toward the core, such that a secure snapping mechanism and a secure mounting are ensured.

A further embodiment of a metal element 15c is shown in FIG. 4C; here as well a circular cut 23 is provided, but the metal element 15c is in quadratic form. The metal element 15d shown in FIG. 4D is also executed in a corresponding manner; this also exhibits an essentially circular cut 24 with a slide opening 25 the shape and function of which correspond to that of the slide opening 22.

It will be understood that, in the embodiments of the metal and spacer elements as shown in FIGS. 4C and 4C, the recesses 9 in the gradient coil unit 6 are naturally not round when viewed in cross-section, but rather are rectangular, namely corresponding to the shape of the metal and spacer elements.

FIG. 5 shows a further embodiment of a shim device 26. The carrier 27 used here is a rod 28 made of a solid material onto which the metal elements 29 and spacer elements 30 are slid in this embodiment. Here no separate segments fashioned over the carrier length are used, which is different from the embodiment according to FIG. 3. Rather, here the entire combination composed of metal and spacer elements 29 and 30 is clamped together by two nuts 31 that are rotated onto corresponding threaded segments 32 at the rod ends. The metal and spacer elements 29 and 30 can exhibit shapes as they are shown in FIGS. 4A-D.

FIG. 6 shows a further embodiment of a shim device 33 having a carrier 34 in the form of a rod with a number of separate rod segments 35. The rod segments 35 are screwed together by corresponding threaded segments. For this purpose, an inner threaded bore 36 is provided on one carrier segment while a threaded peg 37 that is rotated into the inner threaded bore is executed on the other carrier segment to be connected. Furthermore, a separator element 38 is permanently molded on each carrier segment 35, such that here as well separate segments are formed over the carrier length. In this embodiment, the carrier 34 can be adjusted in terms of its length by selecting the number of the rod segments 35. In the case of a need to change the population (equipping) of the carrier, it is possible to unscrew segments at any point in order, for example, to exchange a complete carrier segment that is completely populated with metal elements 40 and spacer elements 41 and to insert a new carrier segment that is completely populated in a different manner. Insofar as the metal and spacer elements 40 and 41 exhibit an open shape as shown in FIGS. 4B and D, this is not absolutely necessary, since the elements can then also be pulled off from one side.

Figure 7:
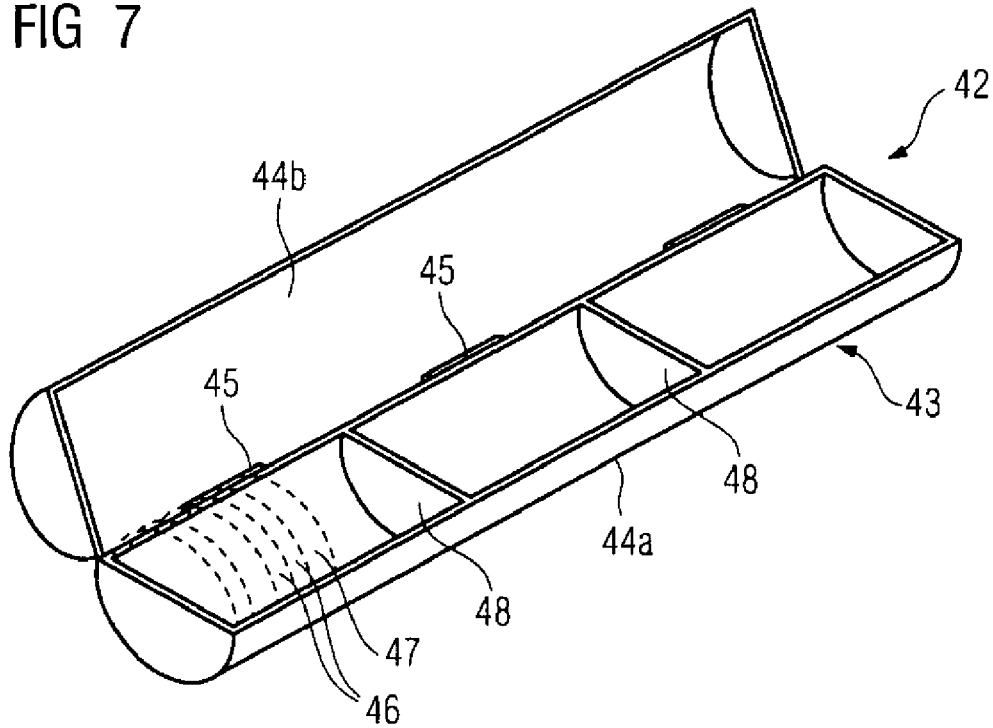
FIG. 7 is a sectional view of an inventive shim device in a fourth embodiment.

FIG. 7 shows a further embodiment of a shim device 42. The carrier 43 here has two half-shells 44a, 44b that can be pivoted relative to one another by suitable hinges 45 such that a circumferentially (and, in the shown example, also frontally) closed tube into which the individual metal elements 46 and spacer elements 47 are inserted results in the closed form. In order to fashion individual segments, separator elements 48 are also provided on the half-shell 44a. In this embodiment, the entire element design and the order thus can be viewed without further measures and even changed without further measures during the setup of the shim device and in the course of an iterative change of the population.

Figure 8:
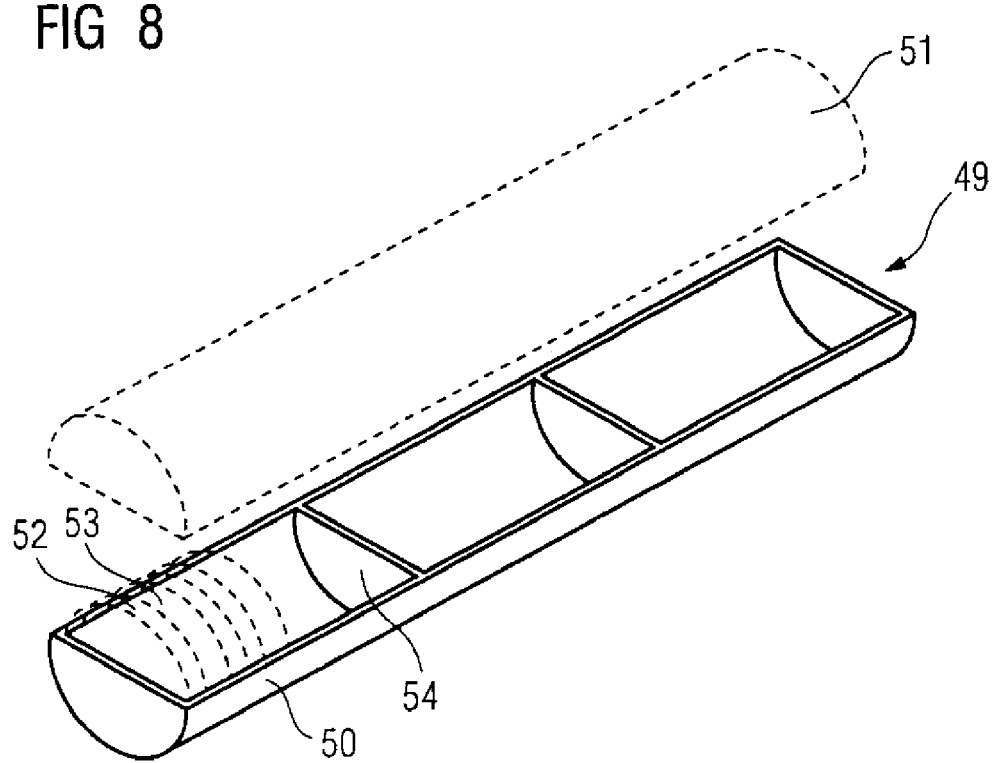
FIG. 8 is a sectional view of an inventive shim device in a fifth embodiment.

FIG. 8 shows a further embodiment of a shim device 49 having a half-shell 50 that can optionally be covered by a second half-shell 51 (which is therefore only shown dashed) that is, for example, produced from a transparent plastic. The second half-shell 51 can be placed on the lower half-shell 50 and, for example, locked thereto. The metal elements 52 and spacer elements 53 are inserted into the half-shell 50 in the predetermined order, and here as well separator elements 54 can be molded in the half shell 50 that is likewise preferably produced from plastic. The possibility now exists to use only the half-shell 50 as a carrier and to insert the configuration open on one side into a receptacle 9. The second half-shell 51 can optionally be placed over this already-equipped unit.

The carrier segments 35 shown in FIG. 6 can also be hollow, such that overall a hollow carrier tube corresponding in terms of its function to the tube 13 from FIG. 3 can be assembled through which coolant can be directed by corresponding connectors. Furthermore, each embodiment can be executed as a shape other than as cylinders, such as rectangles as viewed in cross-section. Moreover, given the use of shim devices without a central coolant supply in the recess 9 of the gradient coil 6, spacers 55 are provided (as shown in FIG. 2 at one recess 9a), that separate the shim device from the inner wall of the recess 9a so that coolant can circulate in this space. The coolant is supplied via cooling lines that can be connected at appropriate connectors (not shown) at the gradient coil unit 6. A tube separated from the recess wall, into which tube a shim device is inserted, can also be used as a spacer. The coolant then flows between the outer tube wall and the recess wall.

Although modifications and changes may be suggested by those skilled in the art, it is the intention of the inventors to embody within the patent warranted hereon all changes and modifications as reasonably and properly come within the scope of their contribution to the art.

We claim as our invention:

1. In a magnetic resonance apparatus having a gradient coil unit comprising a molded body with a plurality of receptacles, and a plurality of passive shim devices respectively in said receptacles, the improvement of each of said passive shim devices comprising:
    a tube-shaped carrier having a longitudinal axis;
    a plurality of ferromagnetic metal elements held on an exterior of said carrier in linear succession, with each of said ferromagnetic metal elements being oriented substantially orthogonally to said longitudinal axis of said carrier; and
    said carrier being hollow and having opposite ends, and comprising respective connectors at said opposite ends, each of said connectors being configured for connection to a coolant line to allow coolant to flow through said hollow carrier.

2. A magnetic resonance apparatus as claimed in claim 1 wherein each of said metal elements has an opening therein, and wherein said carrier has a cylindrical shape and passes through the respective openings in said metal elements.

3. A magnetic resonance apparatus as claimed in claim 2 comprising at least one non-metallic spacer element having an opening therein, said spacer element being disposed between two of said metal elements with said carrier passing through the opening in said spacer element.

4. A magnetic resonance apparatus as claimed in claim 2 wherein said carrier is comprised of a plurality of carrier segments detachably connected with each other in succession.

5. A magnetic resonance apparatus as claimed in claim 2 wherein said carrier has a plurality of grooves proceeding around a circumference of said carrier substantially orthogonally to said longitudinal axis, with a separation element disposed in each of said grooves, said grooves and said separation elements dividing said carrier into a plurality of segments along said longitudinal axis, and said separator elements accommodating tolerance accumulation of the metal elements in each of said segments.

6. A magnetic resonance apparatus as claimed in claim 2 wherein said carrier has opposite ends and comprises clamping elements respectively disposed at said opposite ends that press said metal elements against one another on said carrier.

7. A magnetic resonance apparatus as claimed in claim 6 comprising, at at least one of said ends of said carrier element, a separator element disposed between one of said metal elements and one of said clamping elements, said separator element accommodating tolerance accumulation of said metal elements.

8. A magnetic resonance apparatus as claimed in claim 2 wherein said opening is centrally disposed within the respective metal elements.

9. A magnetic resonance apparatus as claimed in claim 2 wherein said opening is a cutout proceeding from a perimeter of the respective metal elements.

10. A magnetic resonance apparatus as claimed in claim 1 wherein each of said passive shim devices has a cross-section selected from the group consisting of a polygonal cross-section and a circular cross-section.

11. A magnetic resonance apparatus as claimed in claim 1 wherein said carrier is comprised of a material selected from the group consisting of metal and plastic.

12. In a magnetic resonance apparatus having a gradient coil unit comprising a molded body with a plurality of receptacles, and a plurality of passive shim devices respectively in said receptacles, the improvement of each of said passage shim devices comprising:
    a carrier having a longitudinal axis;
    a plurality of ferromagnetic elements carried by said carrier in linear succession, with each of said ferromagnetic metal elements being oriented substantially orthogonally to said longitudinal axis of said carrier; and
    said carrier being a tube-shaped carrier having an exterior, with said ferromagnetic metal elements being disposed inside said tube-shaped carrier, and each of said receptacles has a receptacle wall, and wherein each of said passive shim devices comprising a plurality of spacers between the exterior of said tube-shaped carrier and said receptacle wall, defining a channel configured to receive coolant flowing therethrough.

13. A magnetic resonance apparatus as claimed in claim 12 comprising at least one non-metallic spacer element disposed inside said tube-shaped carrier between two of said ferromagnetic metal elements.

14. A magnetic resonance apparatus as claimed in claim 12 wherein at least a portion of said tube-shaped carrier is comprised of transparent plastic.

15. A magnetic resonance apparatus as claimed in claim 12 wherein said carrier comprises two semi-cylindrical half-shells connected to each other by a connection selected from the group consisting of a detachable connection and a hinged connection.

16. A magnetic resonance apparatus as claimed in claim 15 wherein at least one of said cylindrical half-shells is comprised of transparent plastic.

17. A magnetic resonance apparatus as claimed in claim 15 comprising at least one separator element disposed inside at least one of said cylindrical half-shells, dividing said tube-shaped carrier into a plurality of segments, said separator element accommodating tolerance accumulation of said metal elements.

* * * * *